United States Patent [19]
Oh et al.

[11] Patent Number: 5,959,928
[45] Date of Patent: Sep. 28, 1999

[54] INTEGRATED CIRCUIT MEMORY DEVICES INCLUDING UNIDIRECTIONALLY-ORIENTED SUB-BLOCKS

[75] Inventors: Yong-cheol Oh; Kyu-whan Chong; Won-Hyeong Lee, all of Kyungki-do, Rep. of Korea

[73] Assignee: Samsung Electronics Co., Ltd., Rep. of Korea

[21] Appl. No.: 08/923,905

[22] Filed: Sep. 4, 1997

[30] Foreign Application Priority Data

Dec. 21, 1996 [KR] Rep. of Korea .................. 96-69869

[51] Int. Cl.⁶ ................................................ G11C 13/00
[52] U.S. Cl. ..................... 365/230.03; 365/51; 365/63
[58] Field of Search .................. 365/189.05, 230.03, 365/51, 63

[56] References Cited

U.S. PATENT DOCUMENTS 5,270,975  12/1993  McAdams .............................. 365/200

*Primary Examiner*—Terrell W. Fears
*Attorney, Agent, or Firm*—Myers Bigel Sibley & Sajovec

[57] ABSTRACT

Integrated circuit memory devices include an array of sub-blocks in an integrated circuit. Each of the sub-blocks includes an array of unit cells therein. The unit cells in a sub-block define an orientation direction of the sub-block. The orientation direction of all the sub-blocks in the integrated circuit are unidirectional, i.e. in the same direction. Accordingly, none of the sub-blocks are mirror images of one another. Rather, each of the sub-blocks is a translated, but not rotated, replica of one another.

18 Claims, 7 Drawing Sheets

BLOCK C

BLOCK D

BLOCK C

BLOCK D

BLOCK C

BLOCK D

INTEGRATED CIRCUIT MEMORY DEVICES INCLUDING UNIDIRECTIONALLY-ORIENTED SUB-BLOCKS

FIELD OF THE INVENTION

This invention relates to integrated circuit devices and fabrication methods, and more particularly to integrated circuit memory devices and fabrication methods.

BACKGROUND OF THE INVENTION

As integrated circuit devices become more highly integrated, the fabrication processes for the integrated circuits may become more complicated, and even more stringent process management may be required. These requirements may adversely impact manufacturing productivity and may lower manufacturing yields and reliability of the integrated circuit devices.

An area of increasing integration has been in integrated circuit memory devices. With each new generation of memory devices, more and more bits of data may be stored in a single integrated circuit. However, the increasing memory density may make it more difficult to maintain adequate process tolerances and alignment tolerances in the integrated circuit.

For example, Dynamic Random Access Memory (DRAM) devices that can store more than 16 MB of data in a single integrated circuit, often use three-dimensional capacitor structures to provide the requisite integration density. Capacitor-Over-Bitline (COB) cell structures is one example of a three-dimensional structure. In such a COB cell structure, it is important to insure that there are adequate spacing margins between a Direct Contact (DC) that connects a bit line to a source region of a transistor and a word line, and that there are adequate spacing margins between a Buried Contact (BC) that connects a storage electrode of a capacitor with a drain region of the transistor and a bit line.

In order to provide adequate spacing margins, the unit cell structure is changing from a symmetrical unit cell structure, such as a conventional dog-bone shape, to an asymmetrical unit cell structure. For example, a "T"-type active pattern has now been used for more than three generations of 16 MB DRAM.

As is well known to those having skill in the art, integrated circuit memory devices generally include an array of sub-blocks in an integrated circuit. For example, multiple rows and multiple columns of sub-blocks may be provided. Each of the sub-blocks includes an array of unit cells therein. The unit cells generally include one to four or more memory cells that are addressable by row and by column. The orientation of the unit cells of a sub-block generally define an orientation direction of the sub-block.

Generally, all of the patterns of the sub-blocks are not unidirectional when the memory cell array in a DRAM chip is planned or laid out. For example, half of the integrated circuit may be laid out, and the remaining half is laid out by reflecting the previously laid out part about a horizontal or vertical axis, to provide sub-blocks that are mirror images of one another.

As a specific example, for a 16 MB DRAM that uses a T-type active area pattern, the entire integrated circuit may be divided into four 4 MB sub-blocks. One sub-block is laid out, and this sub-block is reflected about horizontal and vertical axes passing through the center of the integrated circuit, to produce the four sub-blocks that are mirror images of one another. Thus, for a 16 MB DRAM, the upper 8 MB sub-blocks are symmetrical to the lower 8 MB sub-blocks with respect to a row decoder.

In fabricating such memory devices, many variables may affect the spacing margins during fabrication. The margins may vary from one array of sub-blocks to another array of sub-blocks. Accordingly, to preserve the margins above a required minimum, the management of the margin of each individual process must generally be tightly controlled.

The characteristics of the respective sub-blocks, including the spacing margins therein, are closely related to various fabrication processes, such as photolithography, etching, deposition, ion implantation and diffusion. Although the characteristics of the sub-blocks can be measured after fabricating the integrated circuit, it is difficult to predict the changes that misalignments will have on the integrated circuit itself prior to fabrication. Also, if a process variable is controlled in order to increase spacing margins, and thereby reduce potential defects, defects may occur in another sub-block as a result of the control.

SUMMARY OF THE INVENTION

It is therefore an object of the present invention to provide improved integrated circuit memory devices and fabrication methods therefor.

It is another object of the present invention to provide integrated circuit memory devices that can be fabricated with relatively wide process margins while still allowing high yields, high productivity and high reliability.

These and other objects are provided, according to the present invention, by integrated circuit memory devices wherein none of the sub-blocks are mirror images of one another. Rather, each of the sub-blocks is a translated, but not rotated, replica of one another. Stated differently, the unit cells in a sub-block define an orientation direction of the sub-block, and the orientation direction of all of the sub-blocks in the integrated circuit are unidirectional, i.e. in the same direction. By arranging the sub-blocks unidirectionally on an integrated circuit, it is possible to improve yields, productivity and reliability, while insuring adequate spacing margins.

In particular, integrated circuit memory devices according to the present invention include an array of sub-blocks in an integrated circuit. Each of the sub-blocks includes an array of unit cells therein. The unit cells are preferably a two-dimensional array of unit cells and the array of sub-blocks is preferably a two-dimensional array of sub-blocks. The unit cells in a sub-block define an orientation direction of the sub-block. The orientation direction of all of the sub-blocks in the integrated circuit are unidirectional.

Preferably, the unit cells are asymmetric in layout in order to provide high density integrated circuits. For a DRAM unit cell, each DRAM unit cell preferably comprises a symmetrical base and a protrusion that protrudes from the base. Each of the protrusions protrude from the base in the same direction on the integrated circuit substrate.

In a particular embodiment of integrated circuit DRAM devices according to the present invention, each sub-block includes a plurality of storage electrodes and bit lines. The symmetrical base includes a pair of ends, each of which is connected to a storage electrode. The protrusion includes an end that is connected to a bit line. Accordingly, integrated circuit memory devices are provided wherein each of the sub-blocks is asymmetric with respect to one another about all axes on the integrated circuit. By provide asymmetric cell blocks, yields, reliability and productivity may be improved while maintaining adequate spacing margins in all of the cell blocks.

Integrated circuit memory devices may be fabricated according to the present invention by laying out an array of sub-blocks of unit cells in an integrated circuit, such that each of the cell blocks are translated, but not rotated, replicas of one another. Laying out may be provided by laying out a first array of sub-blocks of unit cells in an integrated circuit and translating the first array of sub-blocks over the integrated circuit, without rotation, to thereby lay out the remaining sub-blocks of the array of sub-blocks.

DETAILED DESCRIPTION OF PREFERRED EMBODIMENTS

Figure 1:
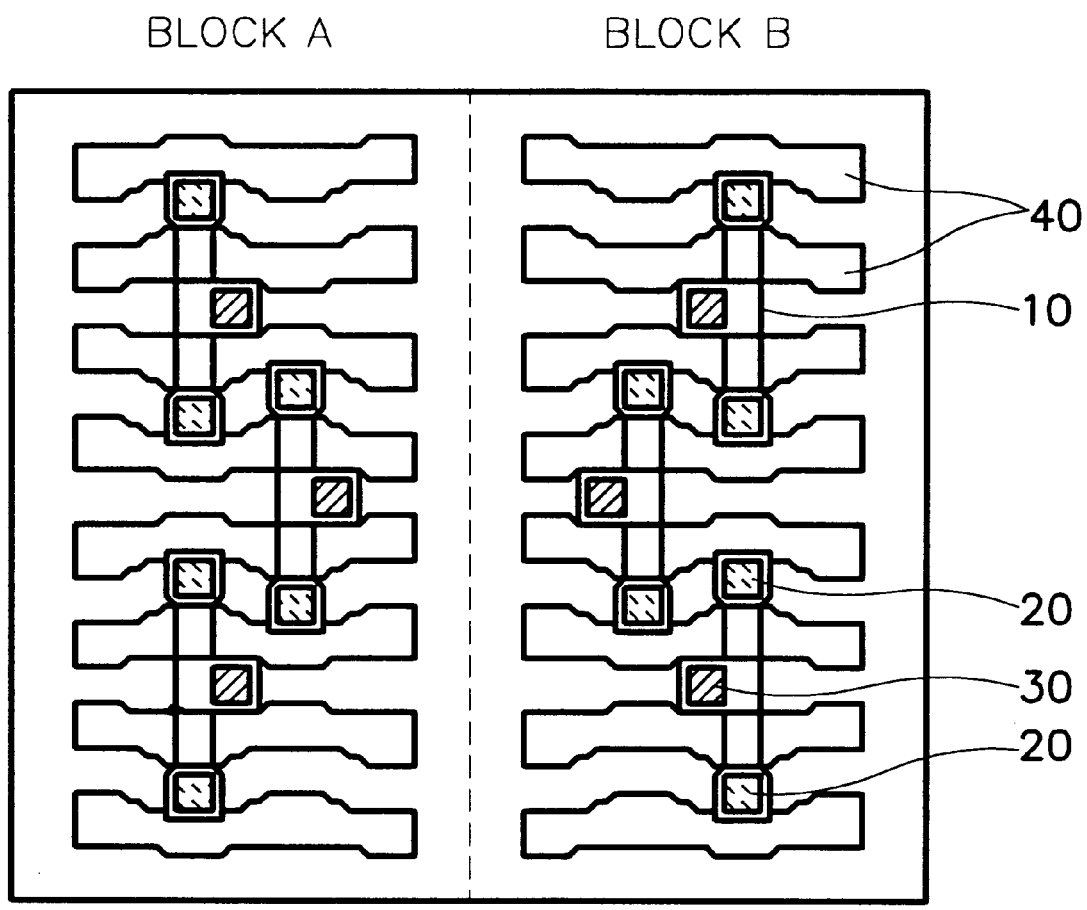
FIGS. 1 through 5 are schematic layout diagrams of conventional integrated circuit memory devices.
Figure 2:
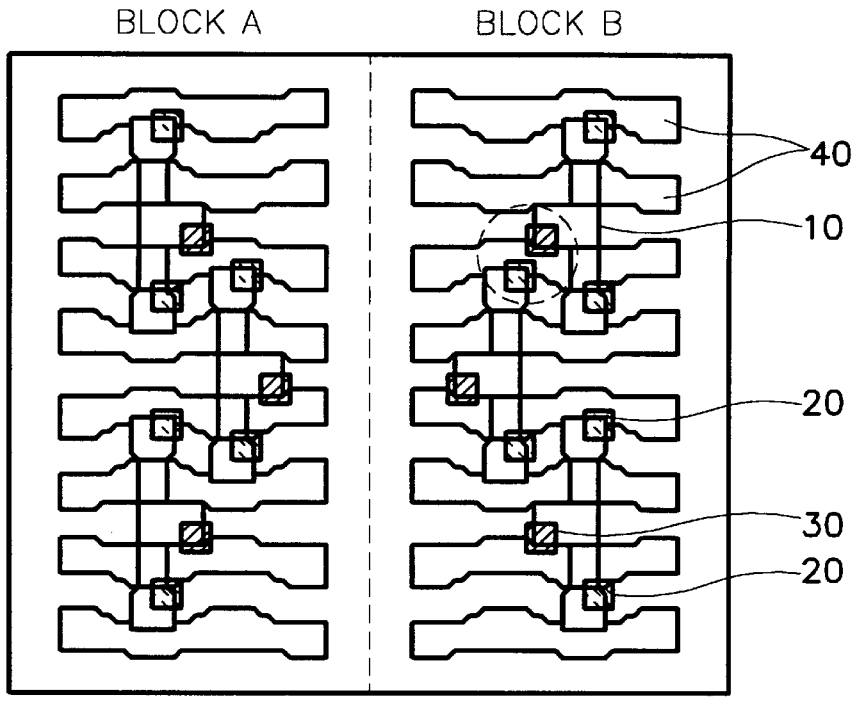
Figure 3:
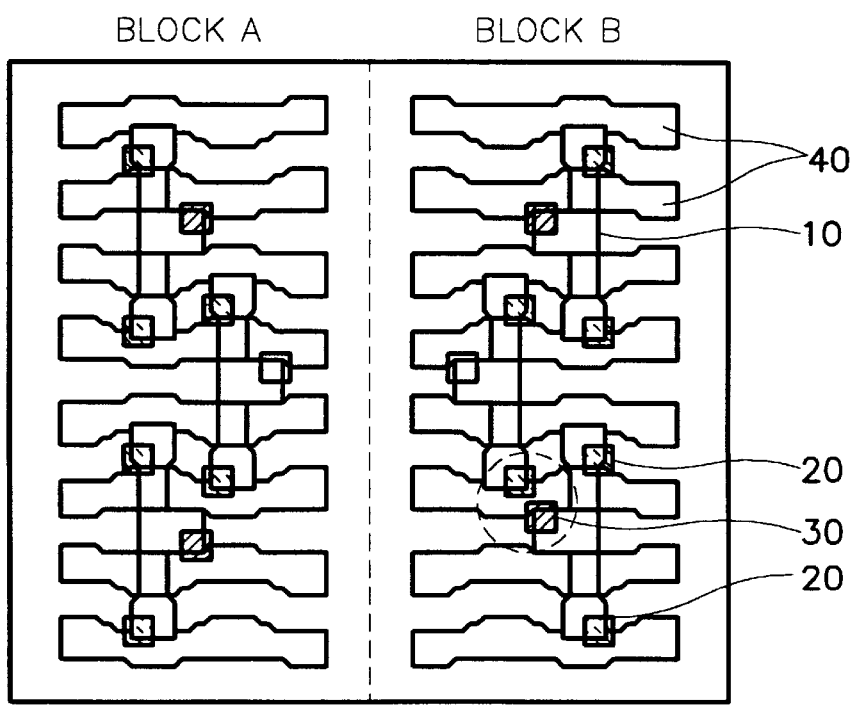
Figure 4:
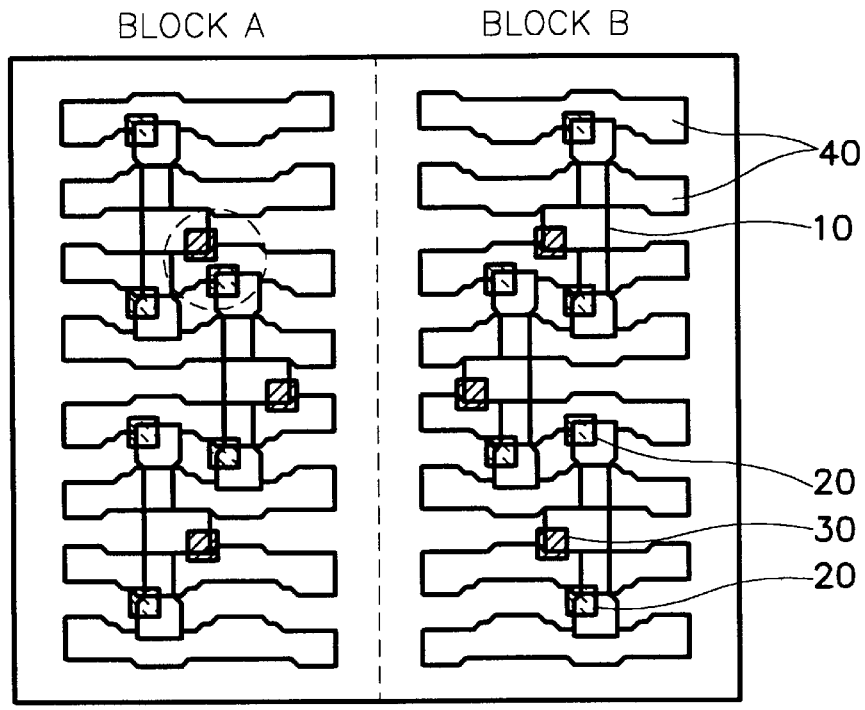
Figure 5:
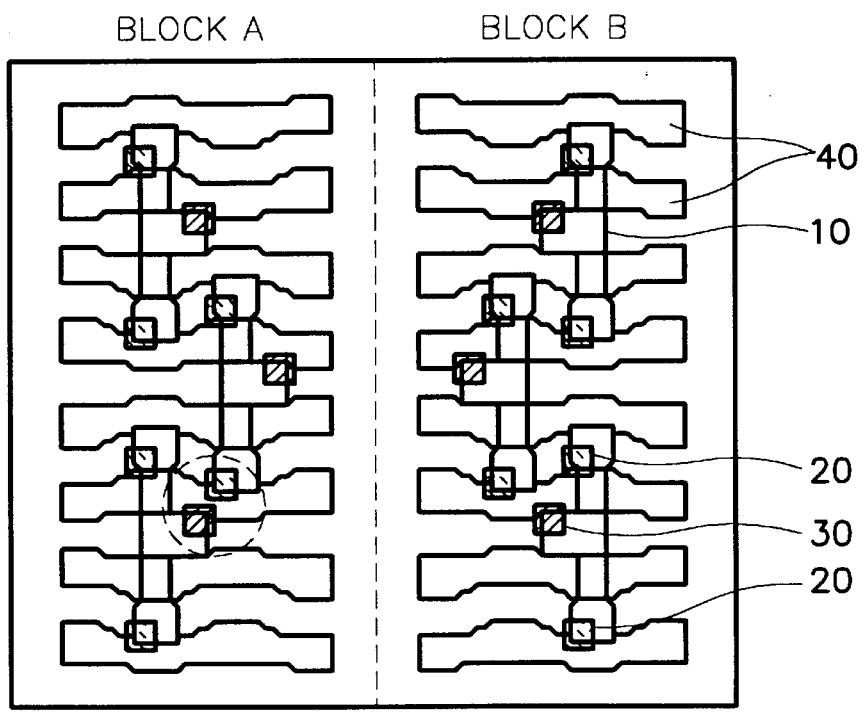

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

In the following Detailed Description, problems that may occur when planning or laying out a conventional integrated circuit memory device including mirror imaged (symmetrical) sub-blocks, will first be described. Then, solutions to these problems that can be provided by unidirectional (asymmetrical) integrated circuit memory devices according to the present invention will be described. In order to refer to a specific design characteristic of an integrated circuit memory device, the spacing between a direct contact (DC) and a buried contact (BC) will be described for a 16 MB DRAM. Inadequate spacing is a common defect which can reduce the reliability and yields of memory devices and can cause very tight tolerances to be imposed on the fabrication processes, thereby decreasing productivity.

Referring now to FIG. 1, a conventional integrated circuit memory device is shown. The memory device may be a third generation 16 MB DRAM which has vertical symmetry of two 28 MB sub-blocks. It will be understood that, for the sake of clarity, the figures illustrate only a small number of units cells and sub-blocks, and that typically more unit cells and sub-blocks are provided. FIG. 1 also assumes that there are no process variables during the manufacturing process.

In FIG. 1, reference characters A and B respectively denote the two sub-blocks of 8 MB. Reference numeral 10 denotes an active area pattern, reference numeral 20 denotes a pattern for forming the BC, reference numeral 30 denotes a pattern for forming the DC and reference numeral 40 denotes a pattern for forming a gate. Referring to FIG. 1, the active area pattern is planned so that the 8 MB on the right side is symmetrical with respect to the 8 MB on the left side, about a vertical axis shown as a dashed line.

As shown in FIG. 1, when symmetrically arranging the patterns of the sub-blocks, the same spacing margin is generally produced in unit cells in the respective 8 MB sub-blocks, when there are no process variables. However, multiple process steps are generally performed in order to fabricate a highly integrated memory device, and many process variables may exist in every process step. For example, consider only a misalignment index with respect to the active area pattern of the DC and BC. It is assumed that an index of misalignment is uniformly set as 0.075 $\mu$m. However, separation characteristics of the DC and BC of the unit cells may differ in the respective 8 MB sub-blocks. Table 1 shows the misalignment indexes added to four integrated circuits in the X and Y axis directions.

TABLE 1

| Integrated Circuit | A<br>X axis/Y axis | B<br>X axis/Y axis | C<br>X axis/Y axis | D<br>X axis/Y axis |
| --- | --- | --- | --- | --- |
| DC Misalignment ($\mu$m) | −0.075/−0.075 | −0.075/+0.075 | +0.075/−0.075 | +0.075/+0.075 |
| BC Misalignment ($\mu$m) | +0.075/+0.075 | +0.075/−0.075 | −0.075/+0.075 | −0.075/−0.075 |

FIGS. 2 through 5 show the changes of the patterns of the sub-blocks when adding the misalignment indexes to integrated circuits A, B, C and D, respectively, as shown in Table 1, during photolithography for forming the DC and BC.

As shown by dashed circles in FIGS. 2–5, when there are misalignment components in the opposite directions, with respect to the active area pattern, during the processes for forming the DC and BC, the electrical characteristics of the left sub-block are different from those of the right sub-block. Thus, poor characteristics may be limited to a specific sub-block. When planning the respective sub-blocks to be symmetrical to each other when a memory cell array including asymmetric cells is planned, the process may need to simultaneously meet the alignment conditions of all the symmetrical sub-blocks. However, this may be very difficult indeed. Therefore, it is almost inevitable that the processing steps will meet the alignment conditions of only one sub-block.

According to the present invention, the sub-blocks of unit cells are laid out so that the unit cells of all the sub-blocks in an integrated circuit are unidirectional, regardless of the types and kinds of the unit cells in a memory device. Stated differently, cell blocks in which the unit cells are unidirectionally arranged are not arranged to have either horizontal or vertical symmetry. Rather, they are asymmetrical about all axes on the integrated circuit. Therefore, a conventional symmetrical cell arrangement is not used, but an asymmetric arrangement is used.

FIGS. 6 through 9 show layouts for fabricating integrated circuit memory devices according to embodiments of the present invention. The drawings show a T-type active area pattern, which is a representative asymmetric unit cell of a 16 MB DRAM. DC and BC patterns are connected to the active area pattern. Reference characters C and D respectively denote 8 MB sub-blocks. Reference numeral 110 denotes an active area pattern. Reference numeral 120 denotes a pattern for forming the BC. Reference numeral 130 denotes a pattern for forming the DC.

As shown in FIGS. 6–9, the unit cell comprises a symmetrical base and a protrusion that protrudes from the base. The base includes a pair of ends, each of which is connected to a storage electrode by a BC. The protrusion includes an end that is connected to a bit line by a DC. As shown, the protrusions define an orientation direction (horizontally and extending to the right in FIGS. 6–9), and the orientation direction of all the sub-blocks is unidirectional. Stated differently, the sub-blocks C and D are not mirror images (symmetrical) about the solid vertical axis between them.

Figure 6:
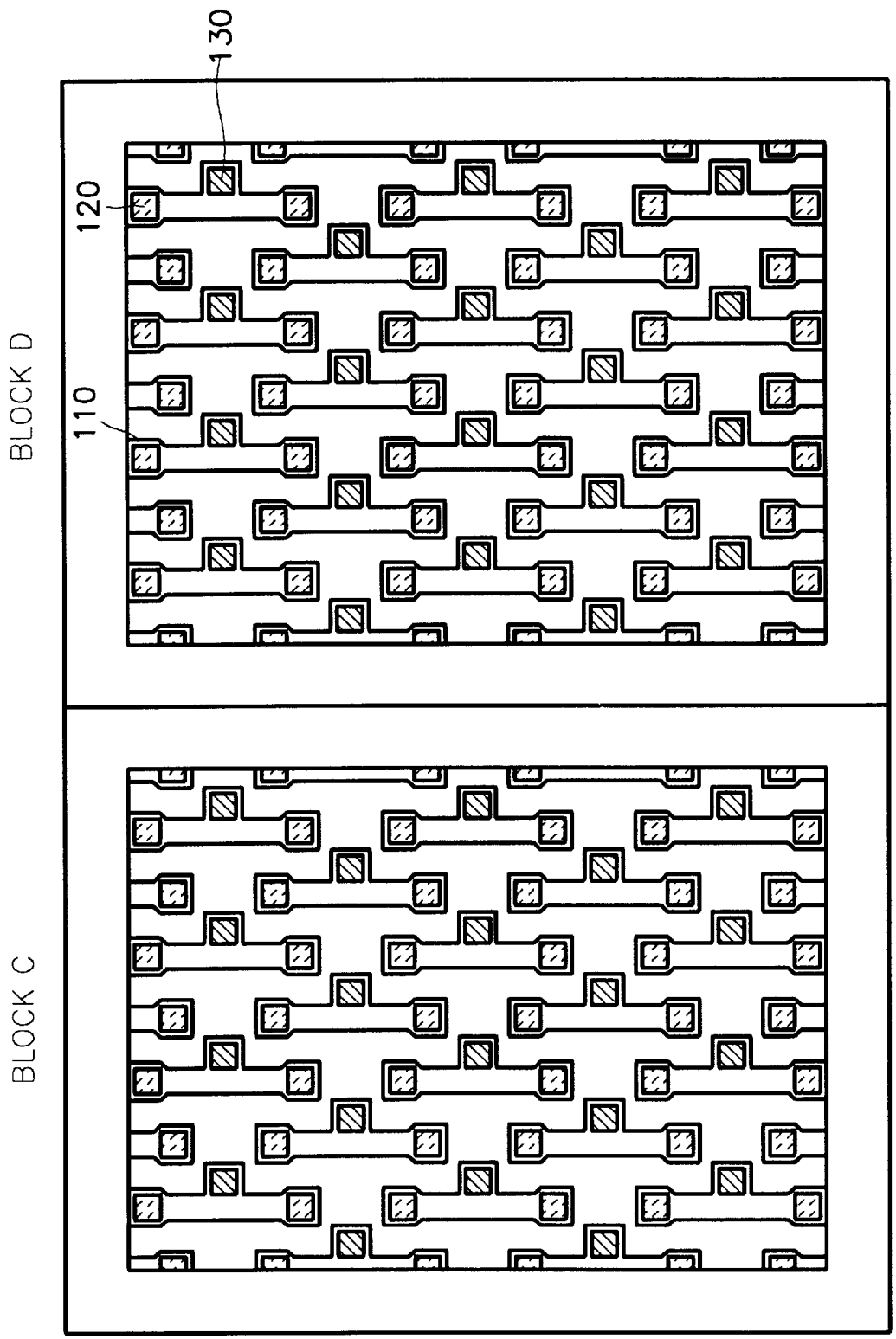
FIGS. 6 through 9 are schematic layout diagrams of integrated circuit memory devices according to embodiments of the present invention.
Figure 7:
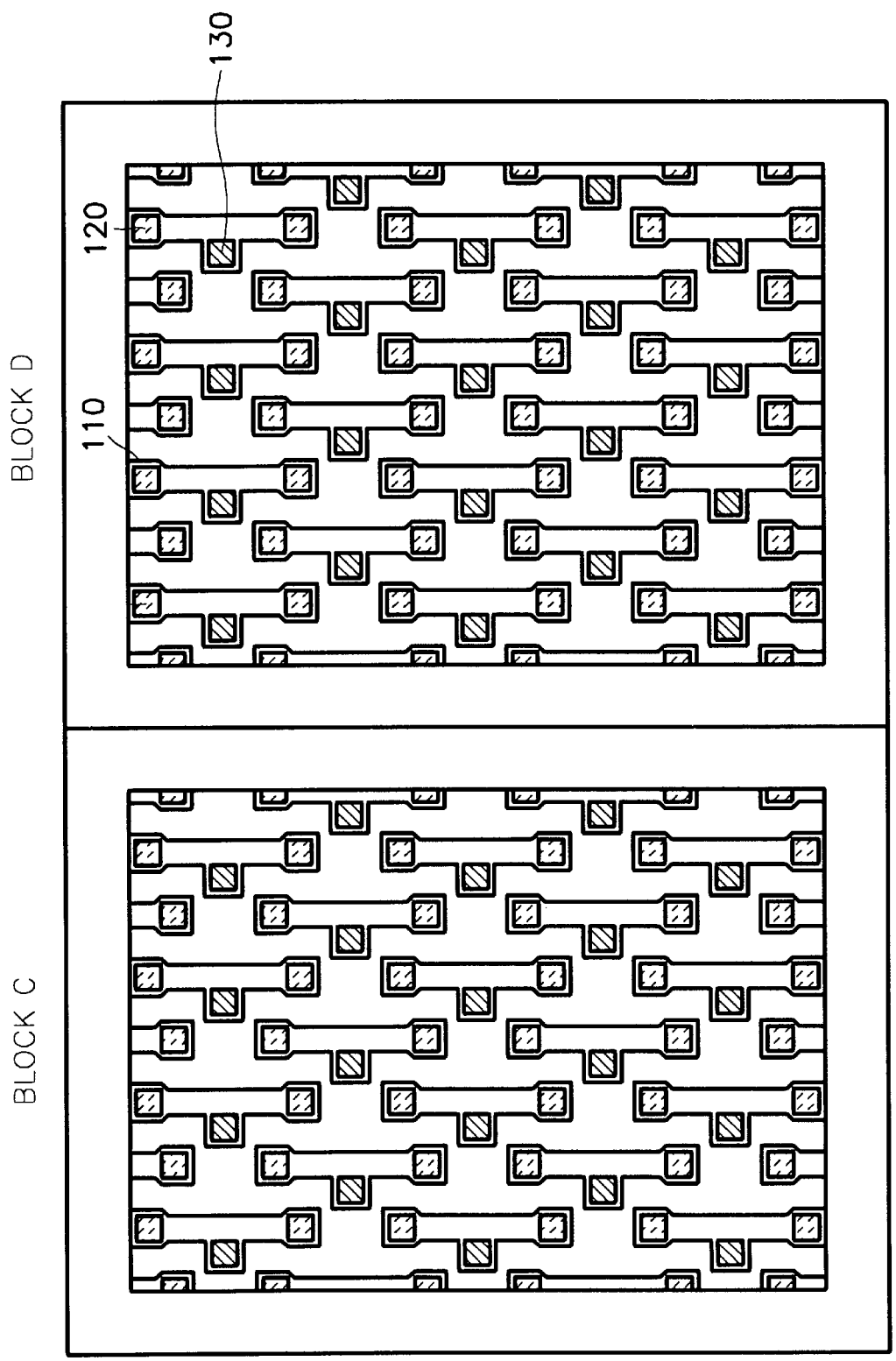
Figure 8:
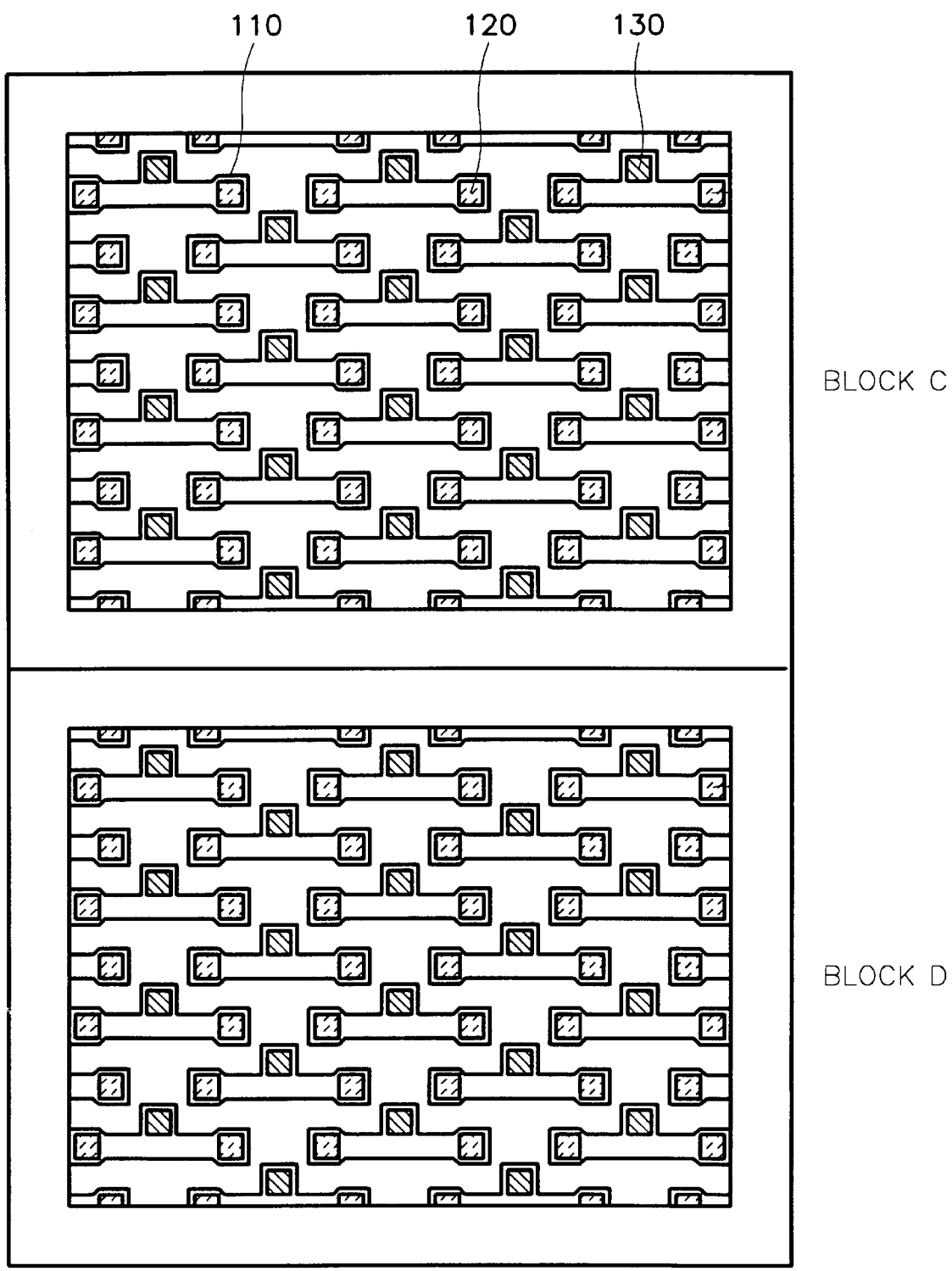
Figure 9:
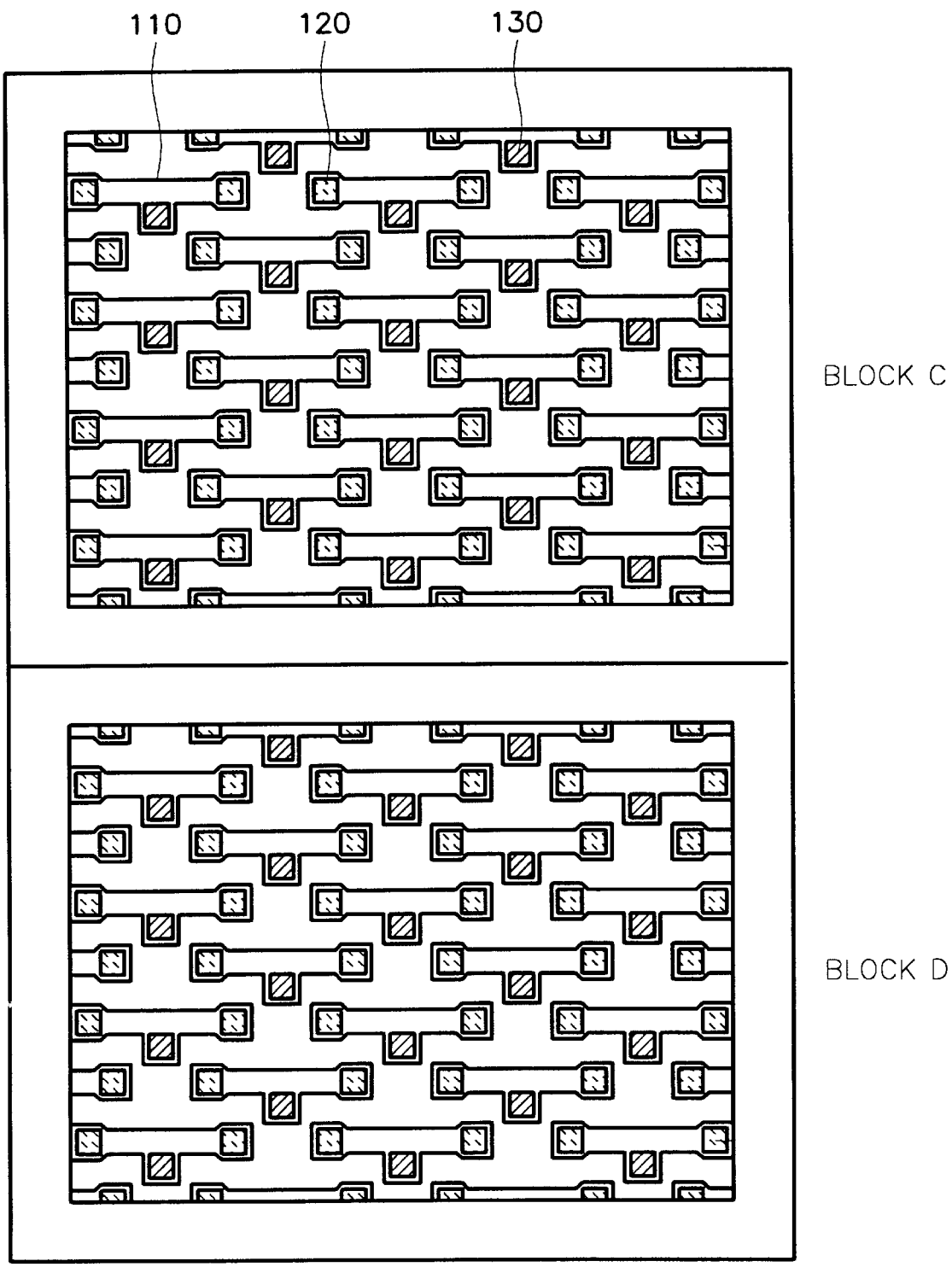

FIG. 6 illustrates all the active area patterns of left and right sub-blocks arranged in a "•" orientation direction. FIG. 7 illustrates all the active area patterns of the left and right sub-blocks arranged in a "•" orientation direction. FIG. 8 illustrates all the active area patterns of upper and lower sub-blocks arranged in a "⊥" orientation direction. FIG. 9 illustrates all the active area patterns of upper and lower sub-blocks arranged in a "⊤" orientation direction.

As shown in FIGS. 6–9, the entire 16 MB memory device is divided into two sub-blocks of 8 MB. All the unit cell patterns in both sub-blocks are unidirectionally arranged. In such an asymmetric cell arrangement, the respective sub-blocks may all have the same spacings and other characteristics in an integrated circuit, based upon variables of the manufacturing processes. Therefore, effective process management can be performed since the number of process variables to be considered during fabrication may be halved. Also, since all the sub-blocks include the same spacing and other characteristics in an integrated circuit, the defects can be corrected by controlling the process variables, and the occurrence of defects or degraded characteristics can be reduced.

The present invention is not limited to the above embodiments, and many variations are possible within the spirit and scope of the present invention by one skilled in the art. For example, the T-type active area was described as an example of the asymmetric cell; however, the asymmetric cell is not limited thereto. Rather, the present invention can be applied to all asymmetric unit cells, i.e. those unit cells that do not have horizontal and vertical symmetry, including unit cell structures having a symmetrical base and a protrusion that protrudes from the base.

According to the highly integrated semiconductor memory devices of the present invention, it is possible to halve the number of process variables to the considered, compared with conventional symmetrical arrangements. This can be achieved by unidirectionally arranging the sub-blocks, formed by arranging the asymmetric unit cells such as the T-type cells, over the entire memory cell array. Therefore, it is possible to improve yields, thus improving productivity, reliability, and allowing wider process margins.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit memory device comprising:

an array of sub-blocks in an integrated circuit, each of the sub-blocks including an array of unit memory cells therein, the unit memory cells in a sub-block defining an orientation direction of the sub-block, the orientation direction of all of the sub-blocks in the integrated circuit being unidirectional.

2. An integrated circuit memory device according to claim 1 wherein the unit memory cells are asymmetric in layout.

3. An integrated circuit memory device according to claim 1 wherein the array of unit memory cells is a two-dimensional array of unit memory cells and wherein the array of sub-blocks is a two-dimensional array of sub-blocks.

4. An integrated circuit memory device according to claim 1 wherein each of the unit memory cells is a DRAM unit memory cell.

5. An integrated circuit memory device according to claim 4 wherein each of the DRAM unit memory cells comprises a symmetrical base and a protrusion that protrudes from the base, each of the protrusions protruding from the base in the same direction on the integrated circuit substrate.

6. An integrated circuit memory device according to claim 5 wherein each sub-block includes a plurality of storage electrodes and bit lines, wherein the base includes a pair of ends, each of which is connected to a storage electrode, and wherein the protrusion includes an end that is connected to a bit line.

7. An integrated circuit memory device comprising:

a plurality of sub-blocks in an integrated circuit, each of the sub-blocks including a plurality of unit memory cells therein that are arranged unidirectionally in the integrated circuit substrate, the plurality of sub-blocks also being arranged unidirectionally in the integrated circuit substrate.

8. An integrated circuit memory device according to claim 7 wherein the unit memory cells are asymmetric in layout.

9. An integrated circuit memory device according to claim 7 wherein the array of unit memory cells is a two-dimensional array of unit memory cells and wherein the array of sub-blocks is a two-dimensional array of sub-blocks.

10. An integrated circuit memory device according to claim 7 wherein each of the unit memory cells is a DRAM unit memory cell.

11. An integrated circuit memory device according to claim 10 wherein each of the DRAM unit memory cells comprises a symmetrical base and a protrusion that protrudes from the base, each of the protrusions protruding from the base in the same direction on the integrated circuit substrate.

12. An integrated circuit memory device according to claim 11 wherein each sub-block includes a plurality of storage electrodes and bit lines, wherein the base includes a pair of ends, each of which is connected to a storage electrode, and wherein the protrusion includes an end that is connected to a bit line.

13. An integrated circuit memory device comprising:

an array of sub-blocks of unit memory cells in an integrated circuit, each of the sub-blocks being translated, but not rotated, replicas of one another.

14. An integrated circuit memory device according to claim 13 wherein the array of sub-blocks is a two-dimensional array of sub-blocks.

15. An integrated circuit memory device according to claim 13 wherein the integrated circuit memory device is a DRAM memory device.

16. An integrated circuit memory device comprising:

an array of sub-blocks of unit memory cells in an integrated circuit, none of the sub-blocks being mirror images of one another.

17. An integrated circuit memory device according to claim 16 wherein the array of sub-blocks is a two-dimensional array of sub-blocks.

18. An integrated circuit memory device according to claim 16 wherein the integrated circuit memory device is a DRAM memory device.

* * * * *